United States Patent
El Markhi et al.

(10) Patent No.: US 10,644,581 B2
(45) Date of Patent: May 5, 2020

(54) DC-DC POWER CONVERSION CIRCUITRY WITH EFFICIENCY OPTIMIZATION USING TEMPERATURE SENSING

(71) Applicant: Texas Instruments Incorporated, Dallas, TX (US)

(72) Inventors: Mustapha El Markhi, Richardson, TX (US); Erhan Ozalevli, Richardson, TX (US); Tuli Dake, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 15/801,295

(22) Filed: Nov. 1, 2017

(65) Prior Publication Data

US 2019/0131863 A1   May 2, 2019

(51) Int. Cl.
| | |
|---|---|
| H03K 3/00 | (2006.01) |
| H02M 1/08 | (2006.01) |
| H03K 17/14 | (2006.01) |
| H02M 3/156 | (2006.01) |
| H02M 1/00 | (2006.01) |
| H02M 1/32 | (2007.01) |

(52) U.S. Cl.
CPC ............ *H02M 1/08* (2013.01); *H02M 3/156* (2013.01); *H02M 3/1563* (2013.01); *H03K 17/145* (2013.01); *H02M 2001/0035* (2013.01); *H02M 2001/0054* (2013.01); *H02M 2001/327* (2013.01)

(58) Field of Classification Search
CPC .................. H02M 1/08; H02M 3/156; H02M 2001/0054; H02M 2001/0035; H02M 2001/327; H02M 3/1563; H03K 17/145
USPC ......................................................... 327/109
See application file for complete search history.

(56) References Cited

U.S. PATENT DOCUMENTS

| | | | |
|---|---|---|---|
| 5,639,163 A | 6/1997 | Davidson et al. | |
| 5,982,221 A | 11/1999 | Tuthill | |
| 6,554,469 B1 | 4/2003 | Thomson et al. | |
| 7,127,368 B2 | 10/2006 | Choi | |
| 7,265,601 B2 | 9/2007 | Ahmad | |
| 9,608,623 B1* | 3/2017 | Kandah | H03K 17/567 |
| 10,384,561 B2* | 8/2019 | Yang | B60L 3/0046 |
| 2006/0001408 A1* | 1/2006 | Southwell | H02M 3/1584 323/282 |

(Continued)

OTHER PUBLICATIONS

Zhao, Chen, "CMOS on-chip temperature sensors for power management," Graduate Theses and Dissertations, 2014. 13649. Iowa State University, Graduate College, http://lib.dr.iastate.edu/etd/13649.

(Continued)

*Primary Examiner* — Metasebia T Retebo
(74) *Attorney, Agent, or Firm* — Mark Allen Valetti; Charles A. Brill; Frank D. Cimino

(57) ABSTRACT

In a described example, an apparatus includes: transistor having a first terminal coupled to an input terminal, a second terminal coupled to an output terminal, and a gate terminal; a temperature sensor configured to sense a junction temperature of the transistor and generate a temperature signal based on the sensed junction temperature; and a gate driver circuit configured to generate a gate signal based on the temperature signal and to output the gate signal to the gate terminal of the transistor.

15 Claims, 8 Drawing Sheets

(56) References Cited

U.S. PATENT DOCUMENTS

| | | | | |
|---|---|---|---|---|
| 2006/0244496 | A1* | 11/2006 | Kawakita | F02P 3/0552 327/110 |
| 2011/0188218 | A1* | 8/2011 | Hsing | H01R 9/00 361/772 |
| 2017/0336265 | A1* | 11/2017 | Sato | G01K 1/026 |
| 2018/0270913 | A1* | 9/2018 | Bredemeier | H05B 6/062 |
| 2018/0294720 | A1* | 10/2018 | Zhu | H02M 3/158 |

OTHER PUBLICATIONS

Chung, Ching-Che, "An Autocalibrated All-Digital Temperature Sensor for On-Chip Thermal Monitoring," IEEE Transactions on Circuits and Systems—II: Express Briefs, vol. 58, No. 2, Feb. 2011.

Luh, Louis et al, "A High-Speed CMOS On-Chip Temperature Sensor," Solid State Circuits Conference, 1999, ESSCIRC, University of Southern California, Los Angeles, CA, ieeexplore.ieee.org/document1471153.

Chen, Shi-Wen, et al, "Fully On-Chip Temperature, Process, and Voltage Sensors," Circuits and Systems, Department of Electronics Engineering & Institute of Electronics and Microelectronics and Information System Research Center (MIRC), National Chiao-Tung University, Hsin-Chu 300, Taiwan, ieeexplore.ieee.org/document/5537410.

Pertijs, Michael A.P., et al, "A CMOS Smart Temperature Sensor With a 3 sigma Inaccuracy of plus/minus of 0.5 degrees C From-50 degree C to 120 degree C," IEEE Journal of Solid-State Circuits, vol. 40, No. 2, Feb. 2005, Digital Object Identifier 10.1109/JSSC.2004.841013.

Chen, Poki, et al, "A Time-to-Digital-Converter-Based CMOS Smart Temperature Sensor," IEEE Journal of Solid-State Circuits, vol. 40, No. 8, Aug. 2005, DOI 10.1109/JSSC.2005.852041.

Bakker, Anton, et al, "Micropower CMOS Temperature Sensor with Digital Output," IEEE Journal of Solid-State circuits. vol. 31, No. 7, Jul. 1996, Publisher Item Identifier S 0018-9200(96)04470-8.

Texas Instruments Application Report, "AN-460 LM34/LM35 Precision Monolithic Temperature Sensors," Texas Instruments, Inc., SNOA748C, Oct. 1986, Revised May 2013, access Nov. 1, 2017 at www.ti.com./lit/an/snoa748c/snoa748c.pdf.

* cited by examiner

DC-DC POWER CONVERSION CIRCUITRY WITH EFFICIENCY OPTIMIZATION USING TEMPERATURE SENSING

TECHNICAL FIELD

This disclosure relates generally to DC-DC converters, and more particularly to DC-DC power converters with efficiency optimization.

BACKGROUND

The advent of small battery powered electronic devices increases the need for decreasing power consumption in most aspects of the electronic circuitry. This includes the operation of microcontrollers, data conversion by analog interface converters and power converters that drive the circuits. Various methods have been used to reduce power consumption including reducing the power supply voltage, reducing the capacitive loading of the internal and external loads, slowing the clock down in various periods and even completely powering down sections of the circuit when it is not in use.

DC-DC power converters output a selected voltage from a different voltage input. Switching power converters use metal-oxide-semiconductor field-effect-transistors (MOSFETS) that are capable of conducting relatively high currents to a load coupled to an output. To provide high current capable devices that also have a relatively low resistance, MOSFET devices referred to as "power MOSFETS" are used in the switching power converters. A power MOSFET device can be implemented using vertical MOSFET devices, and can include vertical double diffused MOSFET devices, "VDMOS". In power converters, power reduction or power loss reduction has been achieved by several methods, including: reducing the gate drive voltage in response to the output load for the drive MOSFETS; by using multiple MOSFETS of varied sizes and only activating the most efficient sized MOSFET for a particular load current; and by changing the switching frequency during lightly loaded conditions. In each of these power loss reduction methods, additional circuitry for measuring the load current are added to achieve the power savings. The measurement circuitry and extra transistors and MOSFETS add to the complexity, cost and size of the power converters.

SUMMARY

In a described example, an apparatus includes: a transistor having a first terminal coupled to an input terminal, a second terminal coupled to an output terminal, and a gate terminal; a temperature sensor configured to sense a junction temperature of the transistor and generate a temperature signal based on the sensed junction temperature; and a gate driver circuit configured to generate a gate signal based on the temperature signal and to output the gate signal to the gate terminal of the transistor.

DETAILED DESCRIPTION

Figure 1:
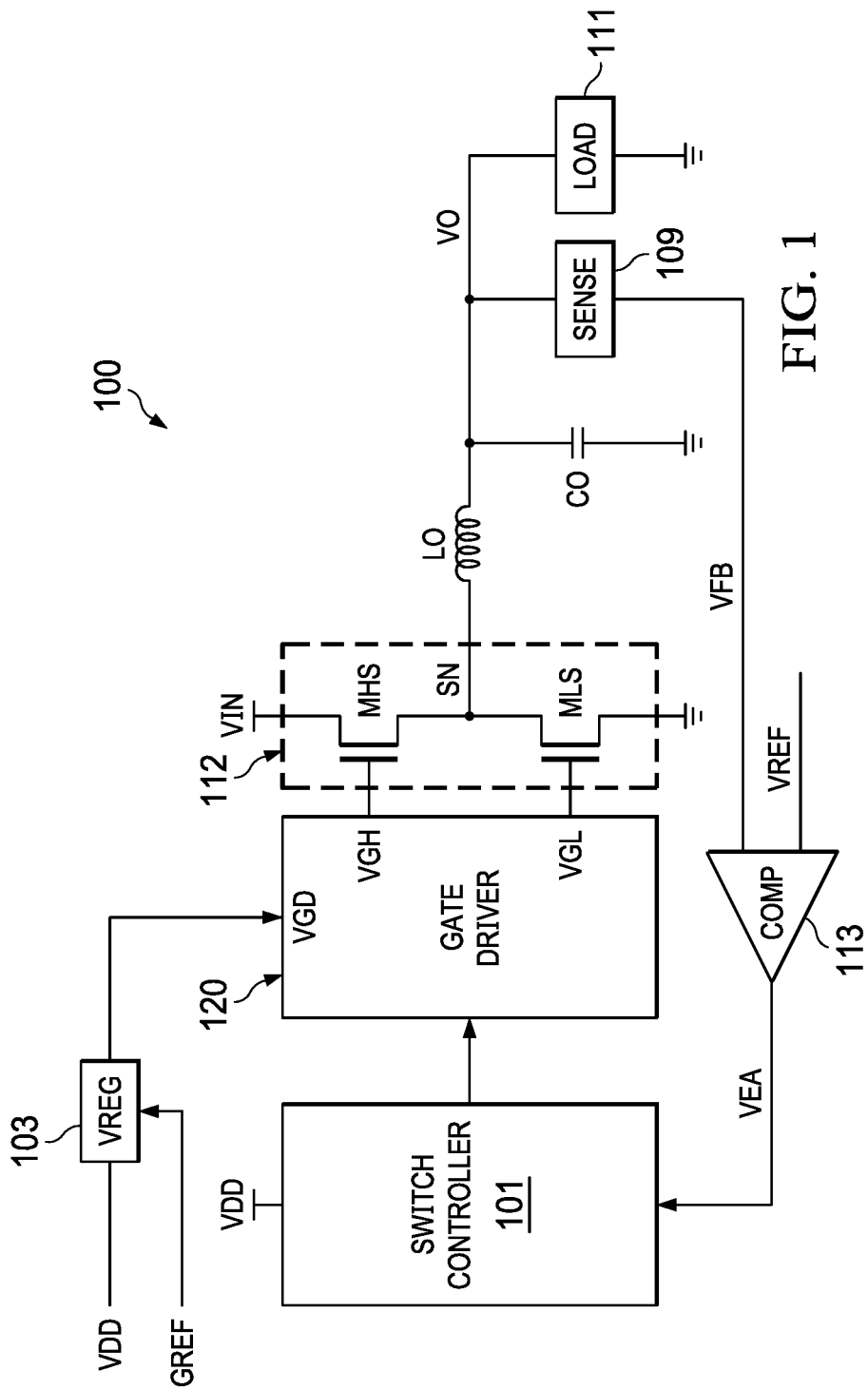
FIG. 1 is a buck converter circuit topology for a DC-DC converter.

Corresponding numerals and symbols in the different figures generally refer to corresponding parts unless otherwise indicated. The figures are not necessarily drawn to scale. The term "coupled" may include connections made with intervening elements, and additional elements and various connections may exist between any elements that are "coupled."

Class-D amplifiers, DC-DC power conversion circuits, and integrated power management systems are arranged to achieve an acceptable conversion efficiency for an expected operating point for a given system. The expected load current and desired output voltage are determined and the MOSFETS used in the power converter are selected to reduce power losses at the expected operating conditions. However, in use of the DC-DC converters, the operating conditions often vary from the expected operating conditions. As the operating conditions vary from the expected operating conditions, the conversion efficiency of the system is generally reduced. Conduction loss is primarily due to the on-resistance (RDSON) of the active MOSFET. A switching DC-DC converter uses two MOSFETS coupled to a switching node. The switching node is coupled to an output by a resonant circuit that includes a capacitor and an inductor. The resonant circuit maintains the voltage at the output while the MOSFETS alternatively couple the switching node to an input voltage, and then to a ground potential. Gate signals turn the two MOSFETS on and off at a switching frequency Fs. Two sources of power loss in a switching DC-DC converter are conduction losses and switching losses in the MOSFETS that drive the output. However, additional power loss in a switching converter also occurs due to the inductor resistance and the equivalent series resistance (ESR) of the output capacitor in the resonant circuit coupled to the switching node in the power converter circuitry. Conduction power losses increase as the load current increases, because the current supplied to the load is conducted by the MOSFET devices. Switching power losses are proportional to the switching frequency Fs of the MOSFETS, because the intrinsic parasitic capacitances within the MOSFETS dissipate power on each transition. To reduce switching power losses, additional circuitry is added to enable the converter circuitry to reduce the gate signal voltage as the load current is reduced, or to reduce the switching frequency Fs, or by performing a combination of both techniques.

There are design trade-offs with respect to the MOSFET transistor sizes: on the one hand, intrinsic parasitic capacitances increase with increasing MOSFET size, and on the other hand, the series resistance for the MOSFET RDSON decreases with increasing MOSFET size. A selection of the MOSFET transistors is made for expected operating conditions with expected load currents. Efficiency of the switching converter is reduced when the conversion circuitry is operated at other conditions.

In one implementation, for example, a disclosed method arrangement uses the junction temperature of a MOSFET as a reference point to periodically adjust the gate drive conditions of the MOSFETS to increase power efficiency. When the MOSFETS are operating inefficiently, power dissipation through the devices causes a rise in the junction temperature of the MOSFETS. If a converter is operating to provide more current at the switching node than the load demands at the output, the excessive current flows from the switching node through the MOSFETS to ground, and the MOSFET devices then carry greater current from the input to ground, increasing transistor activities including depletion, reversion, and electron flow at p-n junctions in the MOSFET devices, and as a result the junction temperature increases. Junction temperature is a reliable indicator of the amount of power loss. Characteristics that lead to increased junction temperature include: process variations; semiconductor age related parameter drift; switching related losses; gate drive related losses; load current related losses; ambient temperature related losses; and user related losses. The load conditions of the power conversion are determined external to the switching converter. In the arrangements of the present disclosure, conversion efficiency within the operating condition is increased, and power loss reduced, by adjusting MOSFET drive conditions such as adjusting the gate drive voltage (which adjusts the MOSFETS resistance RDSON) and adjusting the switching frequency Fs to obtain the lowest junction temperature at a load condition. Advantageously, monitoring and reducing the junction temperature of the switching converter transistors results in increased conversion efficiency for the operating conditions.

FIG. 1 is a circuit diagram for a buck converter circuit topology for a DC-DC switching converter 100. In FIG. 1, the input voltage (which can be a DC input voltage from a battery or which can be another DC voltage) is selectively supplied from an input terminal VIN to a switching node labeled SN through a high side MOSFET (labeled MHS). The switching node SN is also selectively coupled to a terminal for receiving a ground potential by a low side MOSFET (labeled MLS). A gate driver circuit 120 supplies gate signals VGH and VGL to the high side driver and low side driver MOSFETS at a voltage potential determined by the gate drive voltage signal VGD. By supplying the gate signals, the gate driver controls the gate-to-source voltages for the MOSFETS MHS, MLS.

Switching DC-DC converters can supply large currents to the output terminal, for example up to 100 Amperes. Because the high and low side MOSFETS can be quite large to be capable of supplying large output currents, these devices also have relatively high gate current requirements. The gate driver circuit 120 includes driver devices arranged to supply the voltage and currents at the gate terminals needed to switch the high side and low side MOSFETS (MHS and MLS in FIG. 1) on and off. A switch controller 101, which can be a microcontroller unit (MCU) or other programmable processor, or which can be a state machine, supplies pulse width modulation (PWM) control signals to the gate driver circuit 120. The VREG voltage regulator 103 supplies a stable gate drive voltage VGD to the gate driver 120. The gate reference voltage signal GREF allows the voltage regulator VREG 103 to be customized to drive a variety of different MOSFETS at the gate voltage that is most efficient for the designed operating point. A sensing circuit SENSE 109 provides a voltage feedback Vfb that corresponds to the output voltage Vo. A comparator COMP 113 creates an analog error output voltage Vea by comparing the Vfb voltage to a reference voltage Vref. In this example, the reference voltage is used to set the desired output voltage. The COMP 113 analog error output signal Vea.

In operation, the switch controller 101 receives the analog error signal Vea from COMP 113 and controls the operation of the switching converter by adjusting the duty cycle of the PWM signal to the gate driver 120. In lightly loaded conditions, the switching controller 101 can change the control signals to the pulse frequency modulation (PFM) mode to further improve converter efficiency. In PFM mode, the frequency of the switching is reduced to further reduce the current output by the converter when the load does not require current.

In a switching converter power supply using driver MOSFETS, the gate voltages to the high and low side drivers are pulse width modulation (PWM) signals. The PWM signals at the gates of the high and low side transistors MHS and MLS will have varying pulse widths at a constant switching frequency Fs. The pulse widths determine the voltage and current supplied to the load 111. A PWM switching frequency Fs can be as high as several MHz. As the current required by the load falls, the amount of time the high side driver MOSFET MHS is on (and transferring current from the input voltage Vin to the switching node SN) is reduced by reducing the pulse width of the constant frequency signal VGH. The pulse width of the low side gate signal VGL will increase in a corresponding way. As the current required by the load increases, the pulse width of the gate voltage to the high side driver MHS, signal VGH, will increase so that more current is transferred to the resonant circuit formed by the output inductor Lo and the output capacitor Co. The resonant circuit formed by the inductor Lo and the capacitor Co maintains the output voltage Vo. The pulse width of the gate signal to the low side MOSFET, signal VGL, will be reduced in a corresponding way.

In lightly loaded conditions, where the pulse width has reached the minimum pulse width, the switching controller, if configured, can switch to a power saving mode. The power saving mode uses methods such as cycle skipping or pulse frequency modulation (PFM) to improve efficiency in the converter while maintaining Vo at low loads. In cycle skipping, the pulse width is maintained at the minimum pulse width and the frequency is maintained; however, entire pulses are not transmitted by the switch controller. In PFM mode, the pulse width is maintained at the minimum gate pulse width and the switching frequency is modulated. Note that to prevent an unwanted "shoot through" current from flowing through both the high side and low side MOSFETS in either PWM mode or power saving mode, the gate voltage signals VGH and VGL are not allowed to overlap; that is, the two switches MHS and MLS and not turned on at the same time. As described hereinabove, the feedback voltage Vfb is used to control the DC-DC switching converter by monitoring the output voltage Vo, the switch controller 101 can vary the duty cycles of the signals to the gate driver 120 to control the output voltage in the feedback control loop. Other feedback sensing methods include an output current monitor, a load current monitor, an inductor current monitor, and using the high side driver MHS or the load side driver MLS as a current monitor.

The high side MOSFET MHS and the low side MOSFET LHS are devices selected to safely conduct relatively large currents to a load. In order to reduce power consumption, the devices also need to have low on-resistance RDSON. A class of MOSFET devices specifically for power applications are referred to as "power MOSFETS." Power MOSFETS include vertical MOSFET devices, where the drain contact is made to one side of the substrate, and the source and gate contacts are made on the opposing side of the substrate. To further improve performance, the devices can include double diffused drain regions, referred to as "DMOS" devices, and a vertical DMOS device is referred to as a "VDMOS" transistor. Vertical MOSFETS with a grooved V-shaped gate region are referred to as "VMOS" devices. All of these devices are useful in the arrangements of the present disclosure. Lateral DMOS devices or "LDMOS" transistors can be used as well. Power MOSFET devices have low RDSON resistances, and can be switched at high frequencies. Because the power MOSFETS can be fabricated in a different semiconductor processes than other circuitry in the power converter, the power MOSFETS including the high side driver MHS and the low side driver MLS can be provided as discrete transistors. Alternatively, the high side driver MHS and the low side driver MLS can be provided in a combination in an integrated circuit or can be mounted in a single package. In additional alternative arrangements, the high side and low side driver MOSFETS can be integrated with other circuitry such as the gate driver circuitry.

In a power circuit such as the switching DC-DC converter in FIG. 1, the power losses can be categorized into three types: conduction losses; switching losses; and capacitive losses due to charge and discharge of parasitic capacitors and power MOSFET gates.

The conduction losses in a switching converter using the two MOSFETS coupled to the switching node as shown in FIG. 1 can be described by Equation 1:

$$P_{FET} = I_O^2 \times \left[\frac{Vo}{Vin} \times (R_{DSON1} - R_{DSON2}) + R_{DSON2}\right] \quad (1)$$

Where PFET is the conduction power loss, $I_O$ is the current at the output, Vo is the output voltage, Vin is the input voltage, $R_{DSON1}$ is the drain to source resistance for the high-side MOSFET, and $R_{DSON2}$ is the drain to source resistance for the low-side MOSFET.

As can be seen in Equation 1, the conduction power loss is proportional to the MOSFET resistances $R_{DSON1}$ and $R_{DSON2}$. As described hereinabove, RDSON for a MOSFET can be controlled by varying the gate-to-source voltage VGS.

The switching loss in a switching converter in FIG. 1 can be described by Equation 2:

$$P_{switching} = \frac{1}{2} V_{in} \times I_{load} \times [t_{off} + t_{on}] \times f_s \quad (2)$$

Where $P_{switching}$ is switching loss, $I_{load}$ is load current, $f_s$ is switching frequency, $t_{off}$ and $t_{on}$ are the on and off times for the MOSFET device.

By examining Equation 2, it can be seen that the switching loss is proportional to the frequency $f_s$.

Capacitive losses are described in Equation 3:

$$P_{gate\_drive} = C_{total} \times V^2 \times f_s \quad (3)$$

Where $C_{total} = C_{ox} + C_{gb} + C_{ds} + C_{sb} + C_{gd} + C_{gs} + C_{db}$, the capacitances coupled to the switch node in FIG. 1. As can be seen from EQ. 3, loss due to the capacitances is proportional to the capacitances and the switching frequency $f_s$.

Power dissipation results in increasing temperature in MOSFETS. The junction temperature of a MOSFET is measured at the junction between the drain (for an N-channel device, for example, an N-type region) and the body (in the N-channel example, a P-type region) and is described by Equation 4:

$$TJ = PD \times Theta\_JA + TA \quad (4)$$

Where TJ is the junction temperature of the MOSFET junction, PD is power dissipated, Theta JA is the junction to ambient thermal resistance (in degrees C./Watt) and TA is the ambient temperature.

Switching losses and conduction losses result in increased power dissipation PD and corresponding increases in MOSFET junction temperature. In the arrangements, the MOSFET junction temperature is an input variable used to control and vary the gate-to-source voltage VGS (which in turn modifies $R_{DSON}$) for the switching MOSFETS such as MHS and MLS in FIG. 1. In some arrangements, the junction temperature can be used to modify the switching frequency $F_s$. In the arrangements, methods are used to obtain gate voltage settings for the operating conditions to lower the device junction temperature. The arrangements control the gate signals to the MOSFETS and/or the switching frequency Fs to reduce both conduction and switching power losses. The example arrangements are applicable to a variety of power circuits, including: voltage regulators; rectifiers; low drop-out (LDO) regulators; buck, boost, and buck-boost power converters; battery chargers; and other power circuits that use one or more MOSFET devices to deliver current to a load.

Figure 2:
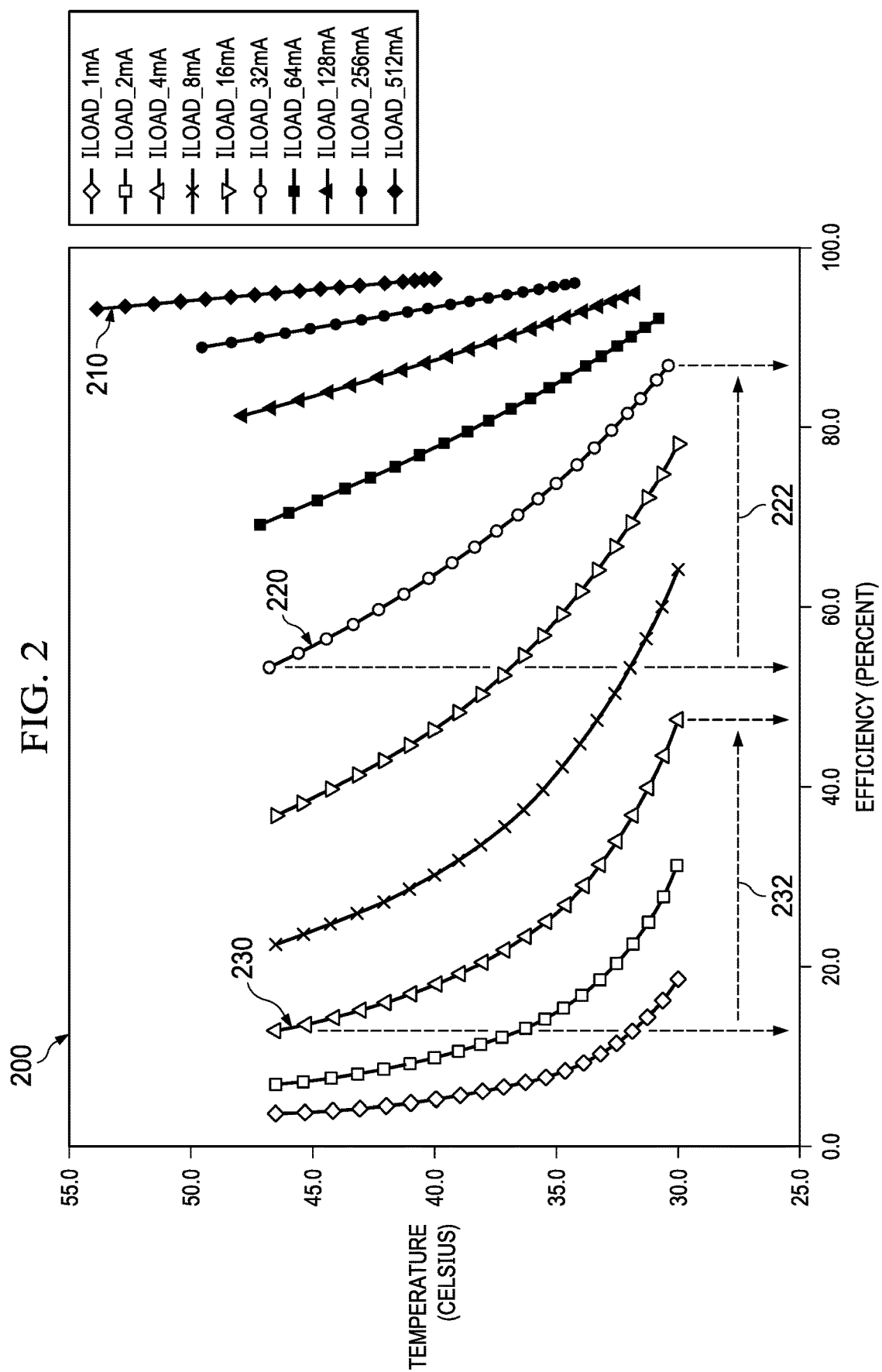
FIG. 2 is a graph of temperature vs conversion efficiency for varying load conditions through example power MOSFETS.

FIG. 2 is a graph plotting temperature vs. conversion efficiency for varying load conditions for example MOSFETS. In graph 200, the vertical axis represents temperature (degrees Celsius) of the junction of the MOSFET and the horizontal axis represents efficiency (in %) of the power conversion of a DC-DC buck regulator such as in FIG. 1. The data lines beginning at the left and moving right represent load currents of 1 mA, 2 mA, 4 mA, 8 mA, 16 mA, 32 mA, 64 mA, 128 mA, 256 mA and 512 mA as measured on an example buck converter designed to run continuously at the 512 mA load level. The 512 mA load current line is labeled 210. Graph 200 shows that for a given load current condition, the junction temperature of the power MOSFET is a reliable indicator of the power efficiency of the power MOSFET. As junction temperature is reduced, the efficiency increases for each load current condition. The efficiency increase is sharper at lower load currents such as line 230, for a load of 4 milliamps, however even at the higher load currents, lower temperature corresponds to increased efficiency. Line 220, for example is for a load of 32 milliamps. Graph 200 was produced with specific parameters as an example and other efficiency gains can be experienced with other parameters.

Data line 210 shows that the reducing the junction temperature by about 30% results in an efficiency gain at a current of 512 mA of a few percentage points. At the lower current ratings, such as data line 220, the 32 mA load current line, the efficiency improvement 222 is 34% as the temperature drops by 17° C. The 4 mA data line 230 also shows a significant improvement 232 of 34% percent as the temperature drops 17° C.

Figure 3:
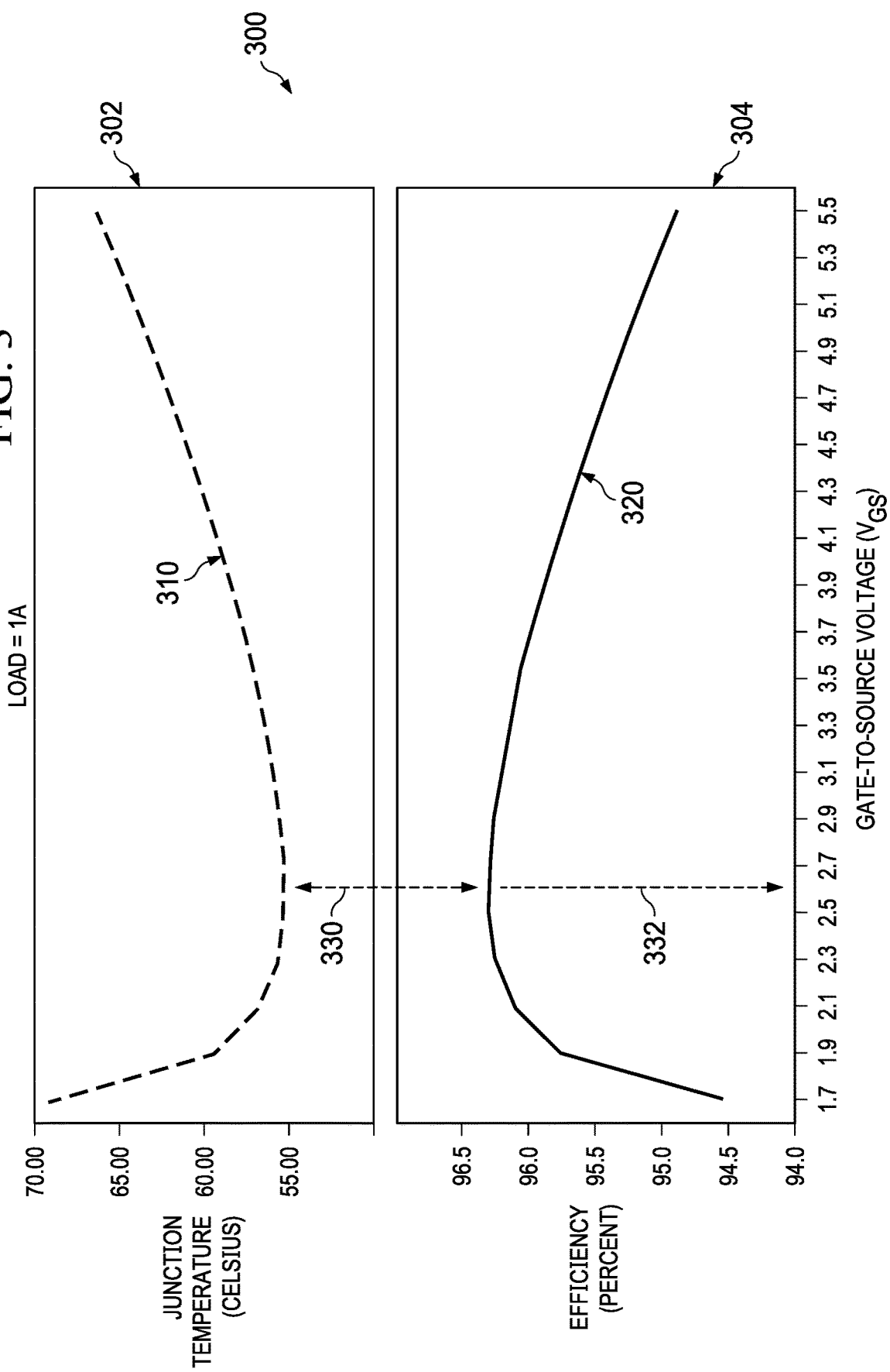
FIG. 3 illustrates two graphs of junction temperature and efficiency with one amp load currents.

FIG. 3 illustrates two graphs of junction temperature and efficiency plotted against that gate-to-source voltage VGS for a MOSFET with one amp load currents. In FIG. 3, the vertical axis of graph 302 is junction temperature (in Celsius) and the vertical axis of graph 304 is power MOSFET operating efficiency (in percentage). The horizontal axis on both graphs 302, 304 is the gate to source voltage VGS of the transistor switch. Both data lines 310 and 320 show a load current of one amp with data line 310 showing the relationship between junction temperature and VGS, while data line 320 illustrates the relationship between conversion efficiency and VGS.

As the gate to source voltage VGS is increased from 1.8V to 5.4V, FIG. 3 shows that when the junction temperature reaches its minimum value of 55° C., the operating efficiency reaches its peak value of 96.5% as indicated by indicator 330. For the example graph showing the results for a one amp load current, the optimum gate to source voltage VGS is 2.6V as shown by indicator 332. The two graphs also show that controlling the gate to source voltage of the MOSFET can minimize the junction temperature for a given load current. The graphs 300 were produced with specific parameters as an example and other efficiency gains can be experienced with other parameters.

Figure 4:
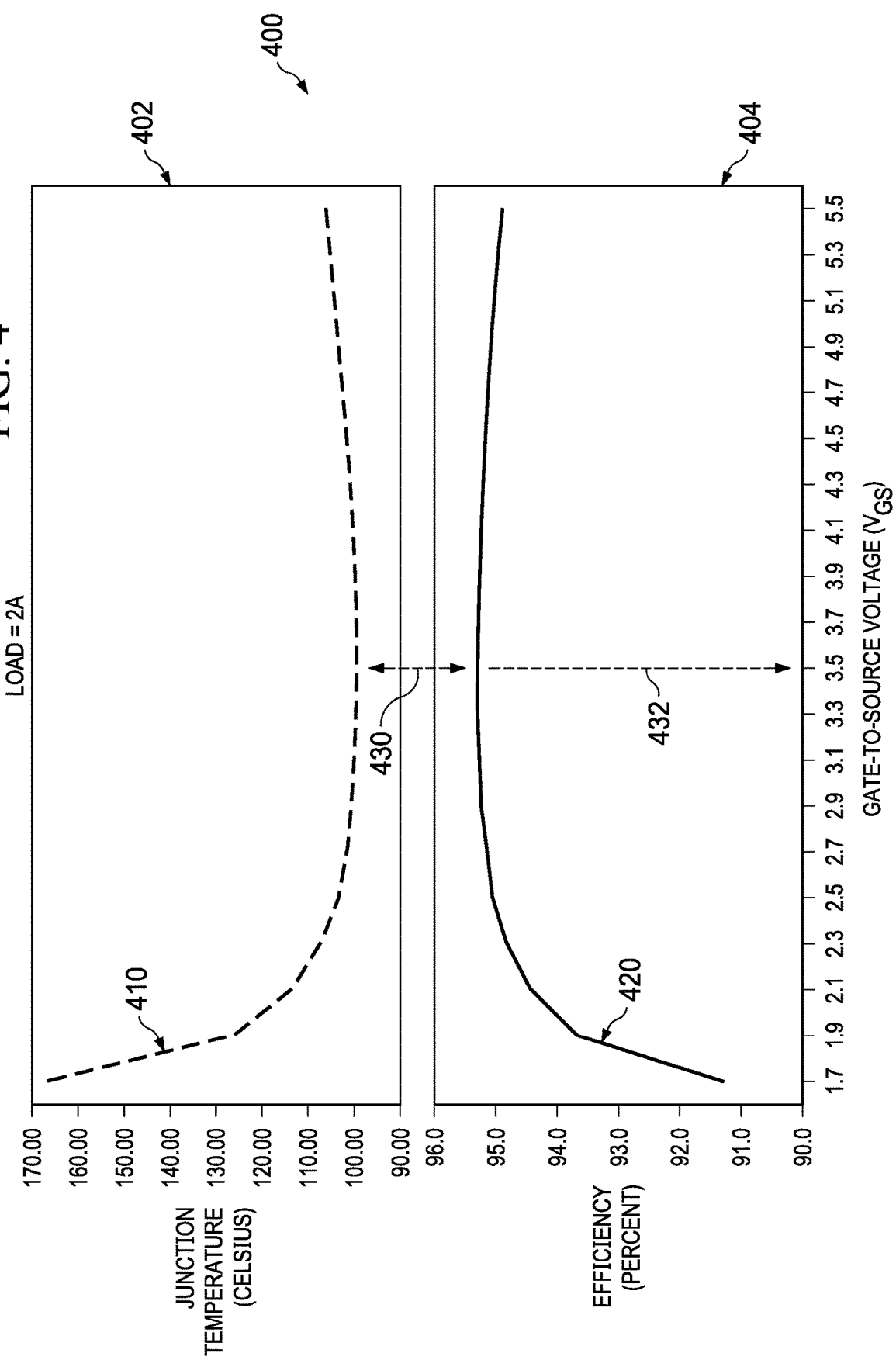
FIG. 4 illustrates two graphs of junction temperature and efficiency with two amp load currents.

FIG. 4 illustrates two graphs of junction temperature and efficiency with two amp load currents. In graph 400, the vertical axis of graph 402 is junction temperature (in degrees C.) and the vertical axis of graph 404 is operating efficiency (in percentage). The horizontal axis on both graphs 402, 404, is the gate to source voltage VGS of the power MOSFET. Both data lines 410 and 420 are at a load current of two amps with data line 410 showing the relationship between junction temperature and the gate-to-source voltage VGS, and data line 420 showing the relationship between conversion efficiency and VGS. Ramping VGS from 1.8V to 5.4V shows that after the temperature reaches its minimum value of 98° C., the efficiency reaches its peak value of 95.3% as indicated by 430. For the example graph running at two amps load current, the optimum VGS is 3.5V as shown by 432. The optimum VGS for the one amp load of FIG. 3 and the optimum VGS for the two amp load of FIG. 4 are different by 0.9V. This difference illustrates that as load current conditions change, the operating point for maximum efficiency and minimum device temperature also changes.

An example arrangement increases efficiency of a switching DC-DC power converter by monitoring the junction temperature of a high side or low side MOSFET and adjusting the gate to source voltage VGS and/or switching frequency Fs to reduce or minimize the junction temperature for the operating conditions. The graphs 400 were produced with specific parameters as an example and other efficiency gains can be experienced with other parameters.

Figure 5:
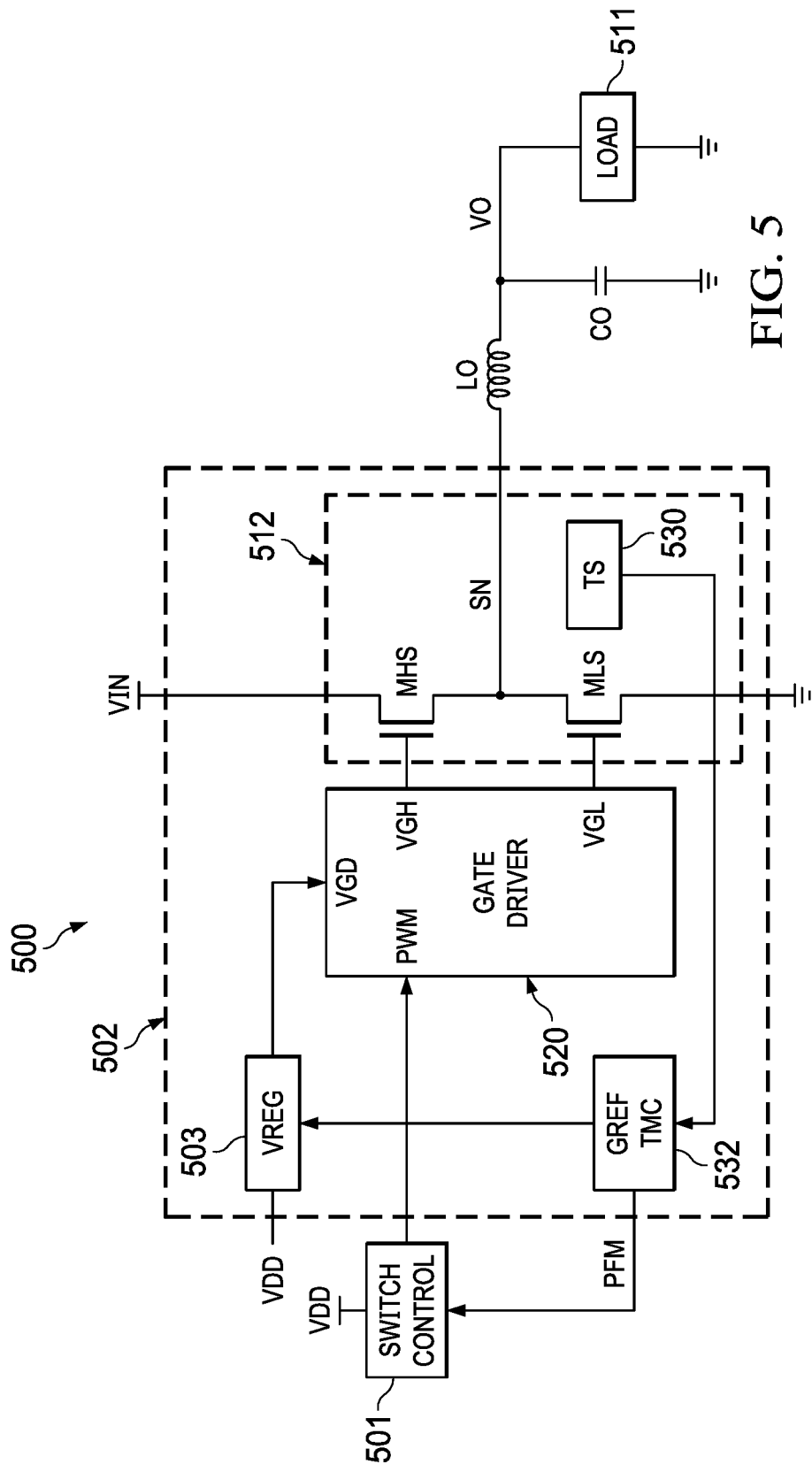
FIG. 5 is a block diagram of an arrangement for a MOSFET driver system with minimum temperature tracking power loss optimization.

FIG. 5 is a block diagram of an example arrangement for a MOSFET driver system with temperature tracking for power loss reduction. The blocks within temperature tracking driver 502 include: a block 512 that includes high side and low side MOSFETS (MHS and MLS) and temperature sensor TS 530, GATE DRIVER (520), VREG (503), Temperature Controller (TMC 532), Switch Controller (SWITCH CONTROL 501), and Temperature Sensor (TS 530). Current flows to LOAD 511 at the output terminal Vo through inductor Lo. A resonant circuit formed by inductor Lo and capacitor Co maintains the output voltage Vo while the high side MOSFET MHS and low side MOSFET MLS alternately couple the switching node SN to the input voltage VIN and to ground. The MOSFET circuit 512 contains high side driver MHS and low side driver MLS along with a temperature sensor TS 530. TS 530 is located on the same substrate as at least one of the MOSFETS MHS, MLS and is positioned so that it senses the temperature of the MOSFET. Temperature sensors useful with the arrangements include temperature sensors that are based on using difference in base to emitter voltages (ΔVBE) in two bipolar devices. The difference in base-emitter voltage is proportional a ratio of collector currents in the two bipolar devices and to the absolute temperature. In an example, a temperature sensor is formed from a voltage proportional to absolute temperature (VPTAT) signal taken from a bandgap reference circuit using two bipolar devices, such as the example illustrated in FIG. 6 and described further hereinbelow. By fabricating the bandgap reference circuit that forms the temperature sensor on the semiconductor substrate that also forms the high side driver MOSFET, and by placing the temperature sensor proximate to the high side driver device on the substrate, the temperature sensor output is representative of the junction temperature of the MOSFET. In an alternative, the temperature sensor can be placed proximate to a low side driver MOSFET, since the current path to ground will cause an increase in that MOSFET's junction temperature when the power converter is operating at an inefficient point, as described hereinabove.

In further alternative arrangements, a temperature sensor includes a polysilicon diode or a pair of diodes fabricated on the semiconductor substrate with and proximate to a power MOSFET, while the diode or diodes are electrically isolated from the power MOSFET. When a bias current is applied to the diode, the forward voltage of the diode is proportional to the substrate temperature, so by forming the diode proximate to the MOSFET device on the same substrate and measuring the voltage, a temperature output signal corresponding to junction temperature is formed. In yet another arrangement, a temperature sensor is formed by coupling a MOSFET in a diode configuration and fabricating the diode connected MOSFET adjacent to a power MOSFET on the same substrate. The diode connected MOSFET receives a steady current from a current source and the MOSFET is coupled between the current source and a ground potential. An output voltage is taken across the diode connected MOSFET. The output voltage of the diode connected MOSFET will change with temperature of the substrate, thereby providing a temperature sensor with an output corresponding to the junction temperature. In still another arrangement, parasitic or "substrate" bipolar transistors formed in the n-p-n junctions of a MOSFET device (drain-body-substrate being n-p-n types or p-n-p types) are used as temperature sensors. These temperature sensors are all useful with the arrangements of the present disclosure. Use of the different temperature sensors with the MOSFETS and controllers form additional alternative arrangements.

In FIG. 5, the example converter is shown as a buck converter for outputting a voltage VO from an input voltage VIN. Boost and buck-boost power converters form alternative arrangements. Use of a temperature sensor and a temperature minimizing controller to control the gate voltage and to reduce the device temperature in the arrangements is applicable to rectifiers, voltage regulators, and battery charge circuits, in addition to converters. Additional arrangements monitor temperature and control gate to source voltage for power MOSFETS supplying current to a load.

In FIG. 5, a signal PWM is an output from the switch controller SWITCH CONTROL 501 to the gate driver 520. Signal PFM is an output from the temperature controller TMC 532 to SWITCH CONTROL 501. Block 512 has an output to LOAD 511 through inductor Lo and receives gate voltage inputs VGH, VGL from GATE DRIVER 520. GATE DRIVER 520 has an input VGD from a voltage regulator VREG 503. Controller TMC 532 has an output signal GREF to regulator VREG 503. The TS 530 has a temperature sensing output coupled to the temperature controller TMC 532.

In this example, TMC 532 uses the temperature data from TS 530 as feedback to adjust the gate voltage of the MOSFETS MHS and MLS in block 512. In this arrangement, controlling the voltage GREF controls the gate driver circuitry. The voltage GREF is supplied to a voltage regulator VREG 503 which outputs the gate drive voltage VGD coupled to the GATE DRIVER 520. Temperature controller TMC 532 also controls the transition between PWM mode and a power savings mode, in this example, pulse frequency modulation (PFM). The PFM signal is output to the SWITCH CONTROL 501. The output signal PFM indicates that PFM regulation is active. PFM is used at light load current conditions to improve efficiency. After the pulse width needed in PWM mode to control the output voltage at Vo is determined to be lower than a minimum gate pulse width, PFM is used to further increase efficiency. The switch controller SWITCH CONTROL 501 provides the PWM switching signals to the GATE DRIVER 520. In PWM mode the SWITCH CONTROL 501 can provide signals at a constant frequency of up to several MHz. In this example, temperature controller TMC 532 is a microcontroller unit (MCU). In alternative arrangements, the TMC 532 can be implemented as a logic state machine. In additional alternative arrangements, user definable integrated circuits such as field programmable gate arrays (FPGAs) and complex programmable logic devices (CPLDs) can be used to implement the TMC 532. Further the TMC 532 can be implemented as a stand-alone dedicated integrated circuit such as an application specific integrated circuit (ASIC). Programmable processor devices including digital signal processors (DSPs), mixed signal processors (MSPs), and microprocessors can be used to implement the switch controller. Executable instructions can be stored in a memory for causing a processor to perform methods of the arrangements.

In an example arrangement, the MOSFETS MHS, MLS, and the temperature sensor TS 530 in block 512 can be implemented as a monolithic integrated circuit. The GATE DRIVER block 520 can also be implemented as a stand-alone integrated circuit. Commercially available gate drivers for MOSFETS can be used. In another alternative, the temperature controller TMC 532 and the GATE DRIVER 520 can be integrated to form an integrated circuit for controlling and driving the MOSFETS MHS, MLS, in block 512. In other arrangements, all of the circuit blocks in 502 can be formed as a single monolithic integrated circuit. In still another arrangement, the blocks other than the power MOSFETS in block 512 can be a single integrated circuit coupled to a second power MOSFET integrated circuit. As shown in FIG. 5, the resonant circuitry for forming the output voltage Vo including an inductor and capacitor (Lo, Co as shown in FIG. 5) are included with the MOSFETS in an integrated circuit that implements block 512. In other arrangements, these passive devices Lo, Co are provided as discrete components external to the circuitry that implements block 512.

TMC 532 receives the temperature information from TS 530. TMC 532 controls the VREG 503 voltage using the GREF voltage output. In this example arrangement, TMC 532 also outputs the signal PFM to indicate a transition to pulse frequency modulation (PFM). The voltage regulator VREG 503 is an adjustable voltage regulator that receives control signal GREF from the TMC 532. Based on the GREF, VREG 503 generates an output voltage to the GATE DRIVER 520. In an example arrangement, VREG 503 can be a low dropout (LDO) voltage regulator. The GATE DRIVER 520 is a circuit or an integrated circuit that drives the gates of the MOSFETS in block 512 with the gate voltages VGH, VGL.

TS 530 is a temperature sensor that is closely located to at least one of the MOSFETS in block 512 on a semiconductor substrate. TS 530 outputs a signal that represents the junction temperature of the MOSFETS MHS, MLS, in block 512. In one example, the temperature sensor is implemented by a current source driving a NPN transistor with the collector and base coupled together that provides a voltage output that is linear with substrate temperature. In an alternative arrangement, the temperature sensor can be implemented using a VPTAT (voltage proportional to absolute temperature) output signal from a bandgap reference generator. An analog to digital converter (ADC) can be included in the TS 530. Alternatively, the output signal from the TS 530 can be an analog signal, and an ADC can be incorporated into the TS 530 or with TMC 532. An example temperature sensor circuit is further described hereinbelow and illustrated in FIG. 6.

Figure 6:
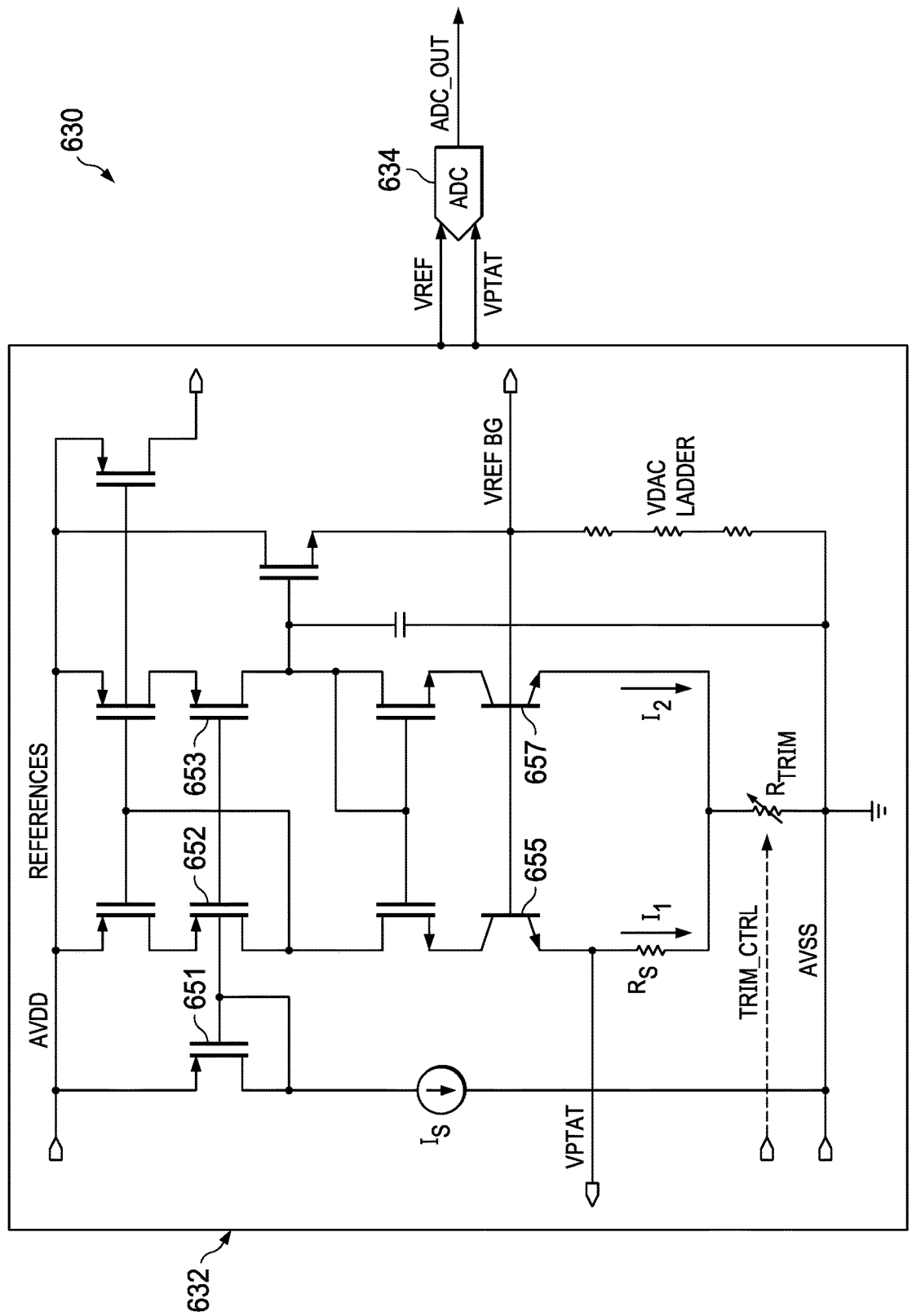
FIG. 6 is a circuit diagram for an example temperature sensor 630 for use with the arrangements.

In operation, the temperature controller TMC 532 starts operating with the voltage VGD from VREG 503 set to output a midpoint voltage for the MOSFETS MHS, MLS in block 512, and the PFM signal is inactive. (When signal PFM is active, the switching control method is pulse frequency modulation. When signal PFM is inactive, another switching method is used, such as pulse width modulation). With PFM inactive, SWITCH CONTROL 501 provides PWM signals to GATE DRIVER 520. GATE DRIVER 520 outputs gate voltages VGH and VGL to the high side and low side MOSFETS in block 512, causing current to flow to the LOAD 511. The power loss within the MOSFETS in block 512 results in a rise in the junction temperature of the MOSFETS MHS, MLS. TS 530 senses the junction temperature of at least one of the MOSFETS in 512. For example, a temperature sensor such as shown in FIG. 6 and described in detail hereinbelow is formed on the same substrate as the power provides a voltage from a VPTAT circuit that corresponds to the junction temperature. The output of TS 530 is coupled to the TMC 532. TMC 532 adjusts the gate reference GREF signal to VREG 503 in response to the output of TS 530. The GREF signal sets the voltage VGD of the GATE DRIVER 520. In an example method, the gate voltage VGD is continually adjusted to lower the junction temperature, which dynamically improves the efficiency of the MOSFETS in block 512 as operating conditions change. When the minimum junction temperature occurs at the minimum gate drive voltage that can be provided, the TMC 532 activates the PFM signal. In response, the SWITCH CONTROL 501, if configured for power savings mode, transitions the switching to a power savings mode such as a PFM. When the minimum temperature occurs at a gate voltage greater than the minimum gate drive voltage, the PFM signal is set to inactive by the TMC 532. In other examples, only the gate voltages VGH, VGL and/or only the switching frequency Fs are adjusted to obtain the lowest junction temperature which dynamically improves the efficiency of the MOSFETS in block 512, by adjusting the gate drive voltages and/or the Fs as operating conditions change. In other alternative methods, the TMC 532 adjusts the gate voltage to reduce the device temperature periodically, not continuously, based on an elapsed time or in additional alternatives, the TMC 532 adjusts the gate voltage in response to temperature as output conditions change.

The components shown and arranged in the block diagram of FIG. 5 are but one example implementation. In alternate configurations that form further arrangements other integrated circuits can be used. In another alternative the functions of the electronic circuitry in block 502 can be combined into a single monolithic integrated circuit, into a few integrated circuits, or can be implemented by use of off-the-shelf integrated circuits other than the ones shown in FIG. 5. Examples include the use of integrated circuits available from a variety of manufacturers including Texas Instruments Incorporated. Various analog-to-digital converter devices (ADCs) with different resolutions can be used. Various programmable controllers, microprocessors, microcontrollers, CPUs, DSPs and other control devices can be used for implementing the TMC 532. Also, integrated circuits that can be user defined such as FPGAs, CPLDs, and ASIC devices can be used to implement portions of the functions shown in 502. Each of these alternative approaches forms additional arrangements of the present application.

FIG. 6 is a circuit diagram for an example temperature sensor 630 for use with the arrangements. FIG. 6 is a temperature sensor 630 that uses a bandgap reference circuit 632 that outputs a temperature insensitive voltage (VREF) and a voltage proportional to absolute temperature (VPTAT). In the bandgap reference circuit 632, a bias current supply Is is coupled to a differential circuit using current mirrors transistors 651, 652, 653. The bandgap reference circuit uses p-n junction devices, here bipolar transistors 655, 657, to develop a temperature dependent voltage (VPTAT) from the difference in base-emitter voltages between bipolar transistors 655 and 657. The voltage across a p-n junction such as those in the bipolar transistors is complementary to absolute temperature (CTAT). A voltage across resistors Rs, Rtrim is proportional to absolute temperature (PTAT). By using the trim control signal TRIM_CNTRL input to adjust the resistor Rtrim, the ratio of resistors Rs and Rtrim can be used to cancel the differences between the PTAT current and the CTAT current.

The resulting temperature insensitive voltage VREG_BG is coupled to the base terminals of bipolar transistors 655, 657. The voltage proportional to absolute temperature VPTAT and the temperature insensitive voltage VREF are input to an analog to digital converter ADC 634 which compares the signals and outputs a digital signal ADC_OUT.

The temperature sensor circuit 630 is formed on the same semiconductor substrate and proximate to at least one of the MOSFET high side and low side devices, and thus temperature sensor 630 outputs a signal (ADC_OUT) proportional to the junction temperature of the power MOSFET devices such as MHS, MLS in FIG. 5, The bandgap reference generator 632 includes current paths that are proportional to absolute temperature (PTAT) and current paths that are inversely proportional to the absolute temperature (IPTAT).

The analog-to-digital converter (ADC) 634 compares the voltage that moves with temperature (VPTAT) to the voltage that is constant with temperature (VREF) and outputs a digital signal ADC_OUT that is proportional to the temperature. In an example arrangement, this digital signal ADC_OUT is used for the temperature sensing signal for the temperature minimization controller.

The arrangement of FIG. 6 is one example of a temperature sensor that can be used in the arrangements. Other temperature sensor circuitry that outputs a signal proportional to the junction temperature for the MOSFETS can also be used as described hereinabove.

Figure 7:
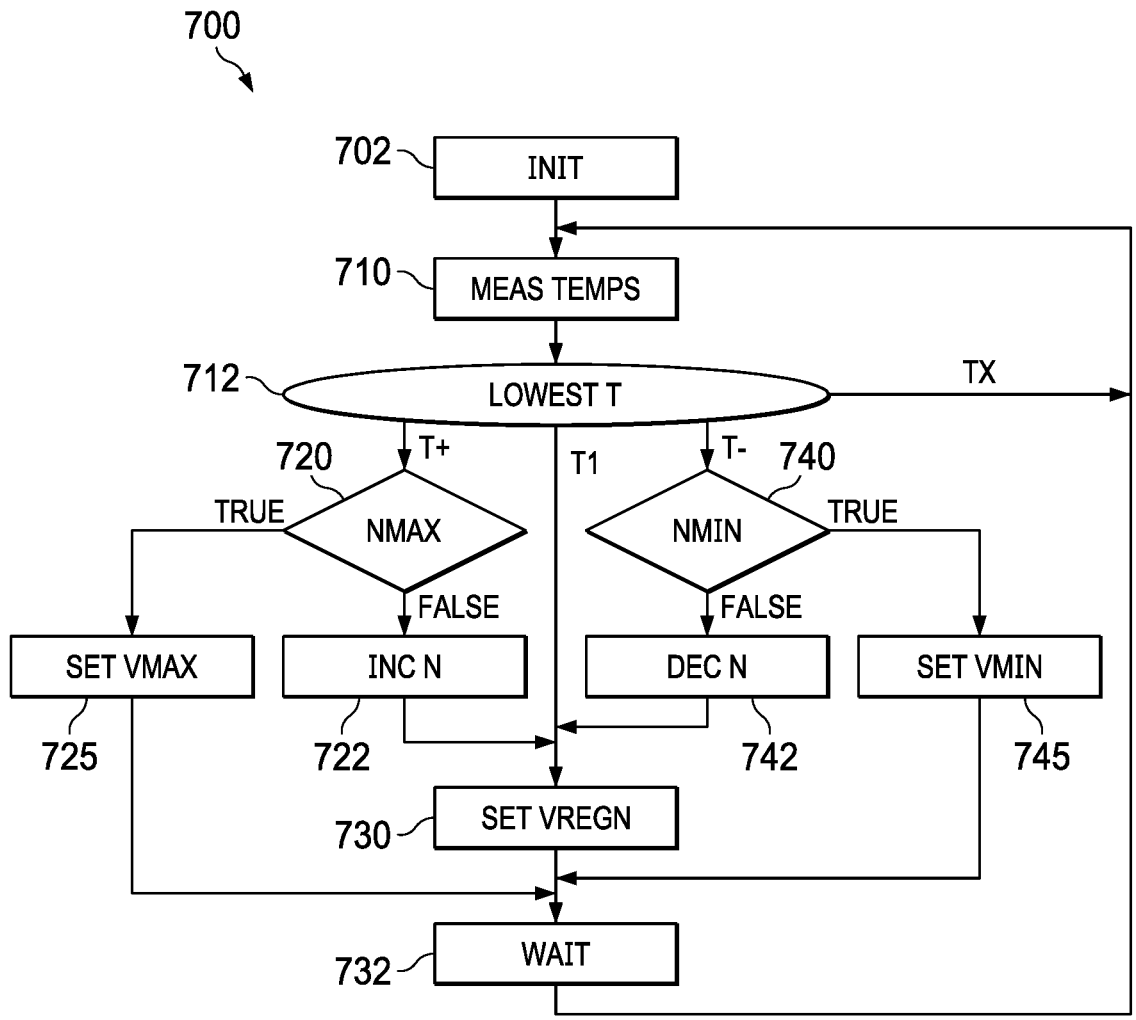
FIG. 7 is a flow chart of an example minimum temperature tracking method.

FIG. 7 is a flow chart of an example minimum temperature tracking method 700. In method 700, a temperature tracking power compensation adjusts gate drive voltage to reduce power loss in the converter operations for the current operating conditions. The temperature controller TMC 532 in FIG. 5 can implement the method 700, for example.

The method 700 begins at step 702, INIT. In step 702, an index N is used for selecting a value of the regulated voltage applied to the gate drivers that drive the high side and low side MOSFET gates, as described hereinabove. A voltage regulator (e.g., VREG 503 in FIG. 5) outputs a range of voltages to the gate driver circuit (e.g., gate driver 520 in FIG. 5) under control of a controller (e.g., controller 532 in FIG. 5) that sets the output of the voltage regulator depending on the value of the integer index N. At step 702 INIT, the controller sets the value for N to an initial point in the middle of a range of values. This value N sets the regulated voltage in a range of stepped voltages between a maximum voltage V max (corresponding to a maximum value for the index N) and a minimum voltage V min (corresponding to a minimum value for the index N). For this example, V min corresponds to the minimum gate drive voltage for a given MOSFET such as 1.8V, and V max is the maximum gate drive voltage for a given MOSFET such as 5.5V. Each increment of the index N results in an increase in the gate drive voltage, such as one tenth of a volt. In this example, N is a range of integers and in the step INIT 702, N is set to a midpoint between N max and N min, such as 20.

Method 700 next transitions to step 710. In step 710, MEAS TEMPS, three temperature measurements are recorded. The voltage regulator (e.g., VREG 503 in FIG. 5) is set to output gate voltages (e.g., using signal VGD in FIG. 5) corresponding to three adjacent values of the indexed range, and measurements for three temperatures T+, T1, and T− are recorded (e.g., by temperature controller 532 in FIG. 5). Before each of the three temperature measurements, the VGD reference voltage is set using an N value by the controller such as 532 and the temperature is measured after a settling time. The settling time allows the MOSFET temperature to stabilize after the new VREG gate voltage setting. For temperature measurement T−, the voltage VREG is set to VREG(N−1). For the temperature measurement T1, the voltage VREG is set to VREG(N) and for the temperature measurement T+, the voltage VREG is set to VREG(N+1). The voltage for VREG(N) is therefore the middle value, corresponding to temperature measurement T1, while VREG(N−1) corresponds to temperature T−, and VREG(N+1) corresponds to temperature T+. The measurements are performed by a controller (e.g., TMC 532 in FIG. 5).

The method 700 now transitions to a decision branch step, 712. In step 712, the controller uses the lowest temperature measurement from the prior step to determine which branch to follow. In the case where not a single temperature is the lowest temperature, the execution proceeds to branch "TX" and the method returns to MEAS TEMPS, step 710. When temperature T1 is the lowest measurement, this indicates that the current voltage VREG(N) is the correct voltage for the operating conditions, and no adjustments to the drive conditions are required to obtain the lowest operating temperature and the highest efficiency. That is, the regulated voltage VREG(N) is the best voltage (lowest junction temperature from the measurements in step 710). With T1 as the lowest temperature in LOWEST T, step 712, branch T1 is executed by the controller and the method transitions to SET VREGN, step 730. In step 730, the voltage output by the voltage regulator (e.g. VDG output by VREG 503 in FIG. 5) is set to VREG(N) by the controller (e.g., TMC 532 in FIG. 5), and the method then transitions to step 732, WAIT. At step 732, the controller waits for a settling time delay duration. The time delay (such as 50 to 100 milliseconds) is used to hold the gate voltage (output by the gate driver such as 520 in FIG. 5) for the power MOSFETS constant for a time longer than the settling time. After the time delay duration is complete in step 732, the method returns to step 710, and the method continues at the MEAS TEMPS 710 block.

Returning to step 712, when T+ is the lowest temperature, the method transitions to a decision block at step 720. In step 720, in the controller (e.g., 532 in FIG. 5), the value for the index N is compared to a maximum value N max. If the comparison is true, the method transitions to step 725 and the controller control the voltage regulator (such as VREG 503) to set the regulated voltage to the maximum value, V max. If the comparison at step 720 is false, the method transitions to step 722, and the controller adjusts the value of N is incremented in step 722, INC N. The method then transitions to step 730 where the voltage is set to a regulated voltage VREGN (now, N+1). In this example, the lowest temperature (T+) was achieved when the gate voltage was at the highest of three settings at step 712, so the gate voltage is increasing. The method then transitions to step 732, WAIT, as described hereinabove. After the delay time elapses, the method returns to the MEAS TEMPS step. 710, and the loop begins again.

Returning to step 712, if the lowest temperature the controller determines is T– at step 712, the method then transitions to a decision branch at step 740. At step 740 the controller tests whether the current value of the index N is at the minimum value N min. If the test at step 740 is true, the method transitions to step 745, where the gate voltage is set to the minimum value V min. After the voltage regulator (e.g., VREG 503) is set to the minimum, the method transitions to step 732, WAIT, and after the delay time elapses, the method returns to step 710. Returning to step 740, if the test is false, and the current value for the index N is not the minimum value, the method transitions to step 742, DEC N. At step 742 DEC N, the controller (e.g., 532 in FIG. 5) decrements the value for N. In this example, the lowest temperature was T– in step 712, indicating the gate voltage should be reduced. After the value of N is decremented in step 742, the method continues to step 730, where the controller (e.g., 532 in FIG. 5) causes the voltage regulator (e.g., 503 in FIG. 5) is set to the output voltage to VREG N (now, N–1), and the method transitions to step 732, WAIT. After the controller waits for the delay time to elapse, the method transitions to step 710 MEAS TEMPS, and the cycle begins again.

In the method 700 of FIG. 7, no change is made to the switching frequency of the power converter, nor is the regulation scheme changed. In an example for a switching power converter, the regulation scheme in the method 700 of FIG. 7 is a pulse width modulation (PWM) scheme with a constant switching frequency Fs. In another scheme, a pulse frequency modulation (PFM) scheme is used. Other variations are also compatible with the temperature sensing control approach of the arrangements.

Figure 8:
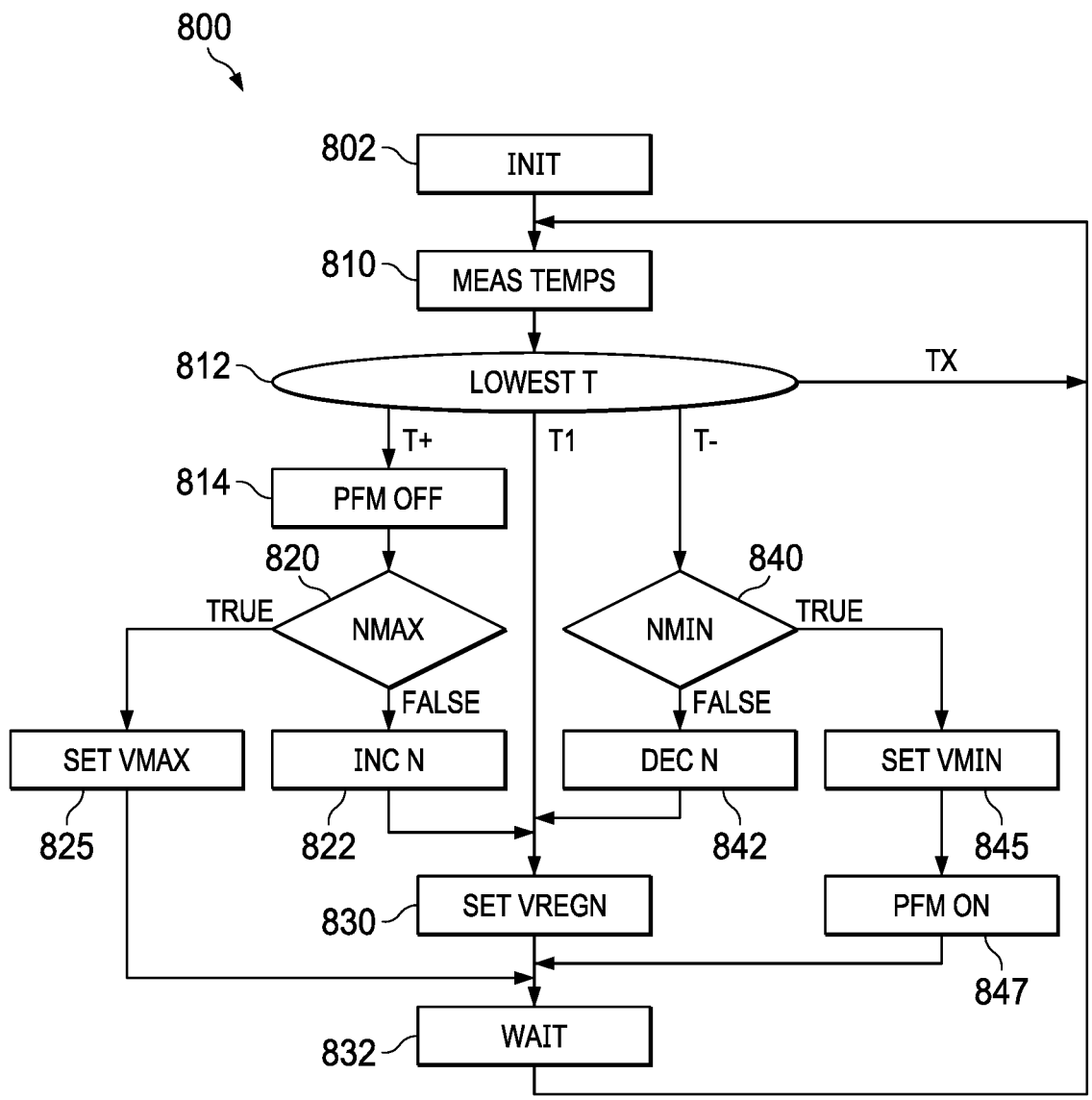
FIG. 8 is a flow chart of an example alternative minimum temperature tracking method.

FIG. 8 is a flow chart of an example alternative temperature tracking method. In method 800, a temperature tracking method adjusts the gate drive voltage and/or the switching frequency $F_s$ to reduce power loss and increase efficiency of the switching power converter.

Operations for the method 800 are similar to those in method 700, with an additional capability to enter a PFM switching mode. In operation, a controller (e.g., TMC 532 in FIG. 5) uses a pointer N is to set voltages applied to the voltage regulator (e.g., VREG 503) used to set the gate voltage (by a gate driver, e.g., 520 in FIG. 5) of the power MOSFET (e.g., MHS in FIG. 5). A higher pointer value corresponds to a higher voltage compared to a lower pointer. N min is the minimum pointer value and N max is the maximum pointer value. For this example, VREG (N min) corresponds to the minimum gate drive voltage (output by a gate driver, e.g., 520 in FIG. 5) for a given power MOSFET, such as 0.0V, VREG (N max) is the maximum gate drive voltage for a given power MOSFET, such as 7.7V, and each increment of N results in an increase in the gate drive voltage, such as one tenth of a volt. In this example, N will be an integer. In block INIT 802, the index N is set by a controller performing the method (e.g., controller 532 in FIG. 5) to a value between N max and N min, such as 38. Another signal is used to indicate PFM (pulse frequency modulation) operation (e.g., output PFM from controller 532 in FIG. 5). Turning "on" the PFM signal indicates the controller is changing the gate drive mode from PWM to a power savings mode, PFM. Turning "off" the PFM signal indicates the controller is leaving the power savings mode returning to PWM mode. In FIG. 5, the signal PFM indicates to the switch control 501 that PFM mode is active. PFM is used to save power from switching losses by lowering the switching frequency for low output current loads. When the lowest gate drive voltage value (the lowest value output by a gate driver, such as 520 in FIG. 5) is not sufficient to reach the lowest junction temperature, switching to PFM mode further reduces the switching frequency Fs, reducing the power losses and the junction temperature of the high side and low side MOSFETS. In most operating conditions, PFM mode is not as desirable as PWM because the variable switching frequency (variable Fs) creates varying harmonic noise. With the increased importance of saving power, the example method in FIG. 8 determines when conditions are such that PFM mode will create additional power savings.

In FIG. 8, the method begins at step INIT, 802. In step INIT 802, a controller (such as 532 in FIG. 5) initializes the PFM mode to OFF and sets the index N to a midpoint value, such as 38 or another midrange value. In the next step, MEAS TEMPS 810, the controller records three temperature measurements: T+; T1; and T–. Before each of the three temperature measurements, the controller sets the VREG voltage (e.g., an output by the regulator VREG 503) is set to a VREG value corresponding to an index N–1; index N; and index N+1, respectively. The temperature is measured by the controller after a settling time elapses, such as 50 to 100 milliseconds. The settling time allows the high side and low side MOSFET temperature to stabilize after the new gate voltage setting. For temperature measurement T–, the controller causes the output of the voltage regulator such as VREG 503 to set to the gate drive voltage to a level corresponding to VREG(N–1). For the temperature measurement T1, the voltage level from the regulator is set to VREG(N); and for the temperature measurement T+, the voltage level from the regulator is set to VREG(N+1).

From step 810, the method transitions to step 812, a decision branch. In step 812, LOWEST T, the three temperatures T–, T1 and T+ previously recorded are compared by the controller (e.g., 532 in FIG. 5) and the method transitions to branch T–, T1 or T+ corresponding to the lowest one of the three temperatures T–, T1, or T+. In the case where not a single temperature is the lowest, the controller takes the branch TX that returns to MEAS TEMPS 810 where the three temperatures, T–, T1, and T+ are measured again.

When T1 is the lowest temperature at step 812, this indicates that the current gate voltage output by a gate driver such as 520 and corresponding to the index value N resulted in the lower temperature reading (when compared to an incrementally higher gate voltage and an incrementally lower gate voltage). In this case, no change to the gate drive voltage or to the switching mode is needed to operate the MOSFETS at the lowest temperature and highest efficiency for the existing drive conditions. When the controller determines temperature T1 is the lowest, branch T1 is executed and the method transitions to step 830, SET VREGN. At step 830 the controller causes the voltage regulator to set the regulator voltage to a level corresponding to VREG(N), and after that the method proceeds to step 832, WAIT. At step 832 the controller (e.g., 532 in FIG. 5) waits for a time delay to elapse. The time delay, such as 50 to 100 milliseconds, holds the power MOSFET gate voltage constant for a time longer than the MOSFET settling time. After the time delay elapses in step 832, WAIT, the controller returns to the step 810, MEAS TEMPS. The temperature T1 corresponds to the current drive state of the power MOSFETS. When this gate voltage results in the lowest temperature measured, no changes to the voltage output by the voltage regulator (e.g., VREG 503) which controls the gate drive voltage, nor the switching mode, is required to maintain the lowest power MOSFET temperature and therefore the highest operating efficiency.

Returning to step 812, when the controller determines that T+ is the lowest temperature, this indicates that a gate voltage higher than the previous gate voltage resulted in a lower temperature reading; indicating a higher gate voltage is needed to operate the MOSFETS at the lowest temperature and highest efficiency for the existing drive conditions. The controller then causes the method to transition using branch T+ to step 814, PFM OFF, and turns the PFM signal off; indicating a switch controller (such as 501 in FIG. 5) is leaving PFM mode and returning to the normal switching mode, PWM or another switching mode. (If the switch controller is not in a power savings mode, the step 814, PFM OFF, has no effect.) The method then transitions to a decision branch at step 820. At step 820, N max, the controller tests to see if the index N is equal to the value N max. If the result of step 820 is true (T), the method transitions to step 825, SET V max. In step SET V max 825, the controller (e.g., 532 in FIG. 5) causes the voltage output by the voltage regulator (e.g., VREG 503) to be set to a maximum voltage, V max. The method then continues to the step 832, WAIT, to wait for a time delay duration. During the time delay in WAIT 832, the controller waits for a delay time such as 50 to 100 milliseconds, the gate driver circuit (e.g., 520 in FIG. 5) holds the gate voltage constant for a longer time than the settling time for the power MOSFETS (e.g., MHS, MLS in FIG. 5). After the time delay elapses, the method continues back to the step 810, MEAS TEMPS.

If the controller determines the result of the decision step 820, N max, is false (F), the method transitions to step 822, INC N, where the index N is incremented by one. The method then continues to step 830, SET VREGN, where the controller causes the regulated voltage from the voltage regulator (e.g., VREG 503) is set to a level corresponding to VREG(N) (now increased to N+1). The method then transitions to step 832, WAIT, as described hereinabove. After the time delay elapses, the method returns to the step 810, MEAS TEMPS.

When the controller determines that the temperature T− is the lowest temperature at step 810, this indicates that a gate voltage lower than the previous gate voltage resulted in a lower temperature reading. A lower gate voltage is needed to operate the MOSFETS at the lowest temperature and highest efficiency for the exiting drive conditions. The controller executes the branch T− when temperature T− is the lowest (at step 810). The method transitions to a decision branch 840 and the controller (e.g., 532 on FIG. 5) tests to see if the index N is at the minimum value N min. If the controller determines the result of the decision in 840 is true (T), the method transitions to step 845, SET V min. In step 845, SET V min, the controller causes the voltage regulator to set the regulator output voltage to a level corresponding to the minimum VREG (N min). The method then proceeds to step 847, PFM ON.

In step 847, the controller outputs the PFM signal which is turned "on". The PFM signal is turned on because the index N is at the minimum, indicating the gate drive voltage (output by a gate driver, e.g., 520 in FIG. 5) is already set to the minimum value, and to further reduce the current to the load, to reduce the device temperature and improve efficiency the method then reduces the switching frequency Fs using a power savings mode. Power savings mode, such as PFM mode, reduces the switching frequency as described hereinabove. In an alternative, a cycle skipping mode can be used to effectively reduce the switching frequency. To operate in PFM mode, the switch controller (such as 501 in FIG. 5) or another circuit monitors the load current and varies the switching frequency Fs, reducing the switching frequency until the output voltage is correctly regulated. (If the PFM signal is already on, step 847, PFM ON has no effect.) The method continues at block 832, WAIT, to wait for a time delay duration. In step 832, the controller waits for a time delay such as 50 to 100 milliseconds and the gate driver (e.g., 520 in FIG. 5) holds the gate voltage constant for a longer time than the MOSFET settling time. After the time delay elapses, the method returns to step 810, MEAS TEMPS.

If the controller (e.g., TMC 532 in FIG. 5) determines that the result of the decision at step 840, N min, is false (F), the method transitions to step 842, DEC N. At step 842, DEC N, the controller decrements the index N. The method transitions to step 830, SET VREGN. At step 830 the controller causes the voltage regulator (e.g., VREG 503) to output a voltage set to a level corresponding to VREG (N−1). The method then proceeds to step 832, WAIT. In step 832, the controller waits for the settling time delay duration such as 50 to 100 milliseconds. The time delay holds the gate voltage constant for a longer time than the MOSFET settling time. After the time delay duration, execution continues back at the MEAS TEMPS 810 block.

The example methods of FIGS. 7 and 8 illustrate flow diagrams with example steps and orders of steps. Alternative methods formed by combining steps, splitting steps and changing the order of steps form additional arrangements of the present application.

Various modifications and combinations of the arrangements, as well as other alternative arrangements, are apparent upon reference to the description. Modifications are possible in the described arrangements, and other additional arrangements are possible, within the scope of the claims.

What is claimed is:
1. An apparatus, comprising:
a transistor having a first terminal coupled to an input terminal, a second terminal coupled to an output terminal, and a gate terminal;
a temperature sensor configured to sense a junction temperature of the transistor and generate a temperature signal based on the sensed junction temperature; and a gate driver circuit configured to generate a gate signal based on the temperature signal and to output the gate signal to the gate terminal of the transistor; and
a voltage regulator coupled to the gate driver circuit, and configured to generate a gate drive level signal to the gate driver circuit based on the temperature signal.

2. The apparatus of claim 1, further comprising:
a temperature controller coupled between the temperature sensor and the gate driver circuit, the temperature controller configured to generate a control signal based on the temperature signal and to generate a modulation signal indicating a pulse frequency switching mode of the gate driver;
wherein the gate driver circuit is configured to generate the gate signal based on the control signal and the modulation signal.

3. The apparatus of claim 2, wherein:
the voltage regulator is coupled between the temperature controller and the gate driver circuit, the voltage regulator configured to generate the gate drive level signal to the gate driver circuit in response to the control signal.

4. The apparatus of claim 2, wherein the temperature controller is a microcontroller unit (MCU).

5. The apparatus of claim 2, wherein the temperature controller is selected from the group consisting of a digital signal processor (DSP), a mixed signal processor (MSP), an application specific integrated circuit (ASIC), a complex programmable logic device (CPLD), a field programmable gate array (FPGA), and a programmable microprocessor.

6. The apparatus of claim 1, further comprising:
a second transistor coupled between a switching node and a ground potential and having a second gate terminal coupled to a low side output of the gate driver circuit; and
a resonant circuit coupled between the switching node and the output terminal;
wherein the transistor is a first transistor coupled between the input terminal and the switching node and having a first gate terminal coupled to the output of the gate driver circuit, wherein the output of the gate driver circuit is a high side output.

7. The apparatus of claim 6, wherein the first transistor and the second transistor are metal oxide semiconductor field effect transistors (MOSFETS) selected from the group consisting of double diffused metal oxide semiconductor (DMOS) devices, vertical double diffused metal oxide semiconductor (VDMOS) devices, and v-grooved gate metal-oxide-semiconductor (VMOS) devices.

8. The apparatus of claim 7, wherein the first transistor, the second transistor, and the temperature sensor are on a monolithic integrated circuit.

9. The apparatus of claim 6, wherein the apparatus forms a switching power converter.

10. The apparatus of claim 6, wherein the apparatus forms a buck switching power converter.

11. A method, comprising:
supplying a first gate signal to a gate terminal of a transistor;
receiving a first temperature signal corresponding to a first junction temperature of the transistor;
supplying a second gate signal to the gate terminal of the transistor, the second gate signal having a lesser voltage than the first gate signal;
receiving a second temperature signal corresponding to a second junction temperature of the transistor;
determining a lowest temperature between the first temperature signal and the second temperature signal; and
supplying one of the first gate signal or the second gate signal to the gate terminal of the transistor based on the lowest temperature.

12. The method of claim 11, further comprising:
supplying a third gate signal to the gate of the transistor, the third gate signal having a higher voltage than the first gate signal;
receiving a third temperature signal corresponding to a third junction temperature of the transistor;
determining the lowest temperature amongst the first temperature signal, the second temperature signal, and the third temperature signal;
and
supplying one of the first gate signal, the second gate signal, or the third gate signal to the gate of the transistor based on the lowest temperature.

13. An apparatus, comprising:
a first integrated circuit, including: a first MOSFET device having a first gate terminal, and having a first terminal for receiving an input voltage and a second terminal coupled to a switching node, a second MOSFET device having a second gate terminal and a first terminal coupled to the switching node and a second terminal coupled to receive a ground voltage, and a temperature sensor configured to output a temperature signal proportional to a junction temperature for at least one of the first MOSFET device and the second MOSFET device; and
a second integrated circuit having a temperature controller coupled to receive the temperature signal, configured to output a voltage control signal to a voltage regulator, wherein the temperature controller is further configured to adjust the voltage control signal in response to the temperature signal;
the voltage regulator configured to receive the voltage control signal and to output a gate driving signal; and
a gate driver circuit coupled to the gate driving signal configured to output gate signals to the first gate terminal and to the second gate terminal of the first integrated circuit.

14. The apparatus of claim 13, and further comprising:
a resonant circuit including an inductor coupled to the switching node and a capacitor coupled to the inductor and to an output terminal, wherein the apparatus is configured to supply a load current at the output terminal.

15. The apparatus of claim 13, wherein the temperature controller is further configured to periodically receive the temperature signal and to periodically adjust the voltage control signal responsive to the temperature signal.

* * * * *